US010121416B2

(12) United States Patent
Cai

(10) Patent No.: US 10,121,416 B2
(45) Date of Patent: Nov. 6, 2018

(54) AMOLED PIXEL DRIVER CIRCUIT AND PIXEL DRIVING METHOD

(71) Applicant: Shenzhen China Star Optoelectronics Technology Co., Ltd., Shenzhen (CN)

(72) Inventor: Yuying Cai, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 142 days.

(21) Appl. No.: 15/328,493

(22) PCT Filed: Dec. 16, 2016

(86) PCT No.: PCT/CN2016/110247
§ 371 (c)(1),
(2) Date: Jan. 24, 2017

(87) PCT Pub. No.: WO2018/045659
PCT Pub. Date: Mar. 15, 2018

(65) Prior Publication Data
US 2018/0218680 A1   Aug. 2, 2018

(30) Foreign Application Priority Data

Sep. 9, 2016  (CN) .......................... 2016 1 0819048

(51) Int. Cl.
*G09G 3/3258*   (2016.01)
*H01L 27/32*   (2006.01)
(Continued)

(52) U.S. Cl.
CPC ......... *G09G 3/3258* (2013.01); *G09G 3/3266* (2013.01); *G09G 3/3275* (2013.01);
(Continued)

(58) Field of Classification Search
CPC .. G09G 3/3258; G09G 3/3266; G09G 3/3275; G09G 2300/0809; G09G 2330/028; H01L 27/3262; H01L 27/3276
See application file for complete search history.

(56) References Cited

U.S. PATENT DOCUMENTS

2008/0246026 A1* 10/2008 Kim .................... H01L 27/3265
257/40
2009/0051628 A1* 2/2009 Kwon .................. G09G 3/3233
345/77

(Continued)

FOREIGN PATENT DOCUMENTS

CN            102005182 A      4/2011

*Primary Examiner* — Abhishek Sarma
(74) *Attorney, Agent, or Firm* — Leong C. Lei

(57) ABSTRACT

The invention discloses an AMOLED pixel driver circuit and pixel driving method, by using a pixel driver circuit of 3T2C structure to effectively compensate threshold voltage of driving TFT in each pixel; through adding a third TFT (T3) and introducing control signal voltage (Vc) to control the third TFT (T3) to prevent current from flowing through in the threshold voltage detection phase and threshold voltage compensation phase so as to reduce the complexity of the power supply (Vdd); by adding a second capacitor (C2) to regulate the influence on the source voltage of the driving TFT by the data signal voltage (VData) so as to reduce the data signal complexity. As a result, the data signal only needs to switch once.

9 Claims, 11 Drawing Sheets

(51) Int. Cl.
   *G09G 3/3275* (2016.01)
   *G09G 3/3266* (2016.01)
(52) U.S. Cl.
   CPC ...... *H01L 27/3262* (2013.01); *H01L 27/3276* (2013.01); *G09G 2300/0809* (2013.01); *G09G 2330/028* (2013.01)

(56) References Cited

U.S. PATENT DOCUMENTS

| | | | | |
|---|---|---|---|---|
| 2011/0254883 A1* | 10/2011 | Tsai | ...................... | G09G 3/3233 |
| | | | | 345/691 |
| 2013/0176296 A1* | 7/2013 | Cho | ...................... | G09G 5/001 |
| | | | | 345/213 |
| 2014/0192038 A1* | 7/2014 | Qin | ...................... | G09G 3/3258 |
| | | | | 345/212 |
| 2016/0284274 A1* | 9/2016 | Tan | ...................... | G09G 3/3258 |

\* cited by examiner

AMOLED PIXEL DRIVER CIRCUIT AND PIXEL DRIVING METHOD

BACKGROUND OF THE INVENTION

1. Field of the Invention

The present invention relates to the field of display techniques, and in particular to an AMOLED pixel driver and pixel driving method.

2. The Related Arts

The organic light emitting diode (OLED) display provides the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

The driving types of OLED can be divided, according to the driving method, into the passive matrix OLED (PMOLED) and active matrix OLED (AMOLED), i.e., the direct addressable type and thin film transistor (TFT) addressable type, wherein the AMOLED provides the advantages of pixels arranged in an array, self-luminous, and high luminous efficiency and is commonly used for high definition large-size display.

AMOLED is a current-driven device that emits light when a current flows through the OLED, and the light-emitting luminance is determined by the current flowing through the OLED. Most of the known integrated circuits (ICs) only transmit voltage signals, so the AMOLED pixel driver circuit needs to complete the task of converting the voltage signal into a current signal. The known AMOLED pixel driver circuit is usually 2T1C structure, that is, two thin film transistors (TFTs) and a capacitor, to convert voltage to current, but the traditional 2T1C pixel driver circuit generally does not provide a compensation function.

As shown in FIG. 1, a known 2T1C pixel driver circuit for AMOLED with a compensation function comprises a first TFT T10, a second TFT T20, and a capacitor Cs, wherein the first TFT T10 is a driving TFT, the second TFT T20 is a switching TFT, and the capacitor Cs is a storage capacitor. Specifically, the gate of the second TFT T20 is electrically connected to the scan signal voltage Vsel, the source connected to the data signal voltage VData, and the drain connected to the gate of the first TFT T10 and one end of the capacitor Cs; the drain of the first TFT T10 is electrically connected to the power supply Vdd, the source connected to the anode of the OLED D; the cathode of the OLED D is electrically connected to the ground; one end of the capacitor Cs is electrically connected to the drain of the second TFT T20, and the other end connected to the source of the first TFT T10.

Referring to FIG. 2, FIG. 2 is a schematic view showing the operation phases of the circuit in FIG. 1 and the waveform of corresponding key nodes. As shown in FIG. 2, the 2T1C pixel driver circuit in FIG. 1 is divided into four operation phases, as follows:

1. Reset phase S10: The scan signal voltage Vsel provides a high level voltage to turn on the second TFT T20, and the data signal voltage VData supplies a first reference voltage Vref1 to the gate of the first TFT T10 via the second TFT T20, i.e., the gate voltage Va=Vref1 of the first TFT T10, the first TFT T10 is turned on, and the power supply Vdd supplies a low level voltage Vdl, and the source voltage Vb=Vdl of the first TFT T10.

2. Threshold voltage detection phase S20: The scan signal voltage Vsel provides a high level voltage to turn on the second TFT T20, and the data signal voltage VData supplies provide a second reference voltage Vref2 to the gate of the first TFT T10 via the second TFT T20, and Vref2<Vref1, i.e., the gate voltage Va=Vref2 of the first TFT T10, the first TFT T10 is turned on, the power supply Vdd supplies a high level voltage, and the source voltage Vb of the first TFT is raised to Vb=Vref2−Vth, wherein Vth is the threshold voltage of the first TFT T10.

3. Threshold voltage compensation phase S30: The scan signal voltage Vsel provides a high level voltage to turn on the second TFT T20, and the data signal voltage VData supplies a display data high level voltage Vdata to the gate of the first TFT T10 and the capacitor Cs ovia the second TFT 20, i.e., the gate voltage Va=Vdata of the first TFT T10, the first TFT T10 is turned on, the power supply Vdd supplies a high level voltage, the source voltage Vb of the first TFT T10 is changed to Vb=Vref2−Vth+ΔV, wherein ΔV is an influence on the source voltage of the first TFT T10 caused by the display data signal high level voltage Vdata.

4. Light-emitting phase S40: the scan signal voltage Vsel provides a low level voltage to turn off the second TFT T20. Due to the storage of the capacitor Cs, the voltage difference between the gate and the source of the first TFT T10 remains unchanged, so that the gate-to-source voltage of the first TFT T10 Vgs=Va−Vb=Vdata−Vref2+Vth−ΔV, able to compensate the threshold voltage of the driving TFT.

However, as the 2T1C pixel driver circuit shown in FIG. 1, the disadvantages of complex signals of power supply Vdd, complex signals of data signal voltage VData, and the necessity of multiple switching remain issues needed to be addressed.

SUMMARY OF THE INVENTION

The object of the present invention is to provide an AMOLED pixel driver circuit, able to effectively compensate the threshold voltage change of the driving TFT, reduce the complexity of the power supply signal and the data signal, and reduce the switching frequency of the data signal.

Another object of the present invention is to provide an AMOLED pixel driving method, able to effectively compensate the threshold voltage change of the driving TFT, and reduce the complexity of the power supply signal and the data signal.

To achieve the above object, the present invention provides an AMOLED driver circuit, which comprises: a first thin film transistor (TFT), a second TFT, a third TFT, a first capacitor, a second capacitor, and an organic light-emitting diode (OLED);

the first TFT having the gate connected to a first node, the source connected to a second node and the drain connected to a power supply;

the second TFT having the gate connected to a scan signal voltage, the source connected to a data signal voltage and the drain connected to the first node and the gate of the first TFT;

the third TFT having the gate connected to a control signal voltage, the drain connected to the second node and the source connected to the first TFT, and the source connected to the anode of the OLED;

the first capacitor having one end connected to the first node and the other end connected to the second node;

the second capacitor having one end connected to the drain of the first TFT and the other end connected to the source of the first TFT;

the OLED having cathode connected to the ground;

the power supply being a constant high voltage, the control signal voltage being a high level single pulse, the data signal voltage being a high level pulse.

According to a preferred embodiment of the present invention, the first TFT, the second TFT and the third TFT are all low temperature polysilicon (LTPS) TFTs, oxide semiconductor TFTs or amorphous silicon (a-Si) TFTs.

According to a preferred embodiment of the present invention, the scan signal voltage, the control signal voltage and the data signal voltage are all generated by an external timing controller.

According to a preferred embodiment of the present invention, the scan signal voltage, the control signal voltage and the data signal voltage are combined to correspond in series to a reset phase, a threshold voltage detection phase, a threshold voltage compensation phase and a light-emitting phase;

in the reset phase, the scan signal voltage and the control signal voltage are high level, and the data signal voltage is a reference low level;

in the threshold voltage detection phase, the scan signal voltage is high level, the control signal voltage is low level, and the data signal voltage is a reference low level;

in the threshold voltage compensation phase, the scan signal voltage first maintains high level and then transits to low level, the control signal voltage is low level, and the data signal voltage is a display data signal high level;

in the light-emitting phase, the scan signal voltage is low level, the control signal voltage is high level, and the data signal voltage is low level.

Another embodiment of the present invention provides an AMOLED pixel driving method, which comprises:

Step 1: providing an AMOLED pixel driver circuit, comprising: a first thin film transistor (TFT), a second TFT, a third TFT, a first capacitor, a second capacitor, and an organic light-emitting diode (OLED);

the first TFT having the gate connected to a first node, the source connected to a second node and the drain connected to a power supply;

the second TFT having the gate connected to a scan signal voltage, the source connected to a data signal voltage and the drain connected to the first node and the gate of the first TFT;

the third TFT having the gate connected to a control signal voltage, the drain connected to the second node and the source of the first TFT, and the source connected to the anode of the OLED;

the first capacitor having one end connected to the first node and the other end connected to the second node;

the second capacitor having one end connected to the drain of the first TFT and the other end connected to the source of the first TFT;

the OLED having cathode connected to the ground;

the power supply being a constant high voltage;

Step 2: entering reset phase:

the scan signal voltage and the control signal voltage providing high level, and the data signal voltage providing a reference low level Vref, the second TFT turned on, the reference low level of the data signal voltage being written into the first node (i.e., the gate of the first TFT), the third TFT turned on, the first TFT cut off, voltage level of the anode of the OLED being written into the second node (i.e., the source of the first TFT);

Step 3: entering threshold voltage detection phase, the scan signal voltage remaining high level, the control signal voltage transiting to low level, and the data signal voltage remaining a reference low level, the second TFT turned on, the first node (i.e., the gate of the first TFT) remaining the reference low level, the third TFT cut off, the second node (i.e., the source of the first TFT) changed to Vref-Vth, wherein Vth being threshold voltage of the first TFT;

Step 4: entering threshold voltage compensation phase, the scan signal voltage first remaining high level and then transiting to low level, the control signal voltage remaining low level, and the data signal voltage providing a display data signal high level, the second TFT turned on, the third TFT cut off, the data signal voltage writing the display data signal high level via the second TFT into the first node (i.e., the gate of the first TFT) and the first capacitor, the second node (i.e., the source of the first TFT) transiting to Vref−Vth+ΔV, wherein ΔV being influence on the source voltage of the first TFT (i.e., the second node) caused by the display data signal high level voltage;

Step 5: entering light-emitting phase, the scan signal voltage remaining low level, the control signal voltage transiting to high level, and the data signal voltage transiting to low level, the second TFT cut off, the third TFT turned on, voltage difference between the first node (i.e., the gate of the first TFT) and the second node (i.e., the source of the first TFT) remaining unchanged due to storage effect of the first capacitor;

the OLED emitting light and current flowing through the OLED independent of the threshold voltage of the first TFT.

According to a preferred embodiment of the present invention, the first TFT, the second TFT and the third TFT are all low temperature polysilicon (LTPS) TFTs, oxide semiconductor TFTs or amorphous silicon (a-Si) TFTs.

According to a preferred embodiment of the present invention, the scan signal voltage, the control signal voltage and the data signal voltage are all generated by an external timing controller.

Yet another embodiment of the present invention provides an AMOLED driver circuit, which comprises: a first thin film transistor (TFT), a second TFT, a third TFT, a first capacitor, a second capacitor, and an organic light-emitting diode (OLED);

the first TFT having the gate connected to a first node, the source connected to a second node and the drain connected to a power supply;

the second TFT having the gate connected to a scan signal voltage, the source connected to a data signal voltage and the drain connected to the first node and the gate of the first TFT;

the third TFT having the gate connected to a control signal voltage, the drain connected to the second node and the source of the first TFT, and the source connected to the anode of the OLED;

the first capacitor having one end connected to the first node and the other end connected to the second node;

the second capacitor having one end connected to the drain of the first TFT and the other end connected to the source of the first TFT;

the OLED having cathode connected to the ground;

the power supply being a constant high voltage, the control signal voltage being a high level single pulse, the data signal voltage being a high level pulse;

wherein the first TFT, the second TFT and the third TFT being all low temperature polysilicon (LTPS) TFTs, oxide semiconductor TFTs or amorphous silicon (a-Si) TFTs;

wherein the scan signal voltage, the control signal voltage and the data signal voltage being all generated by an external timing controller.

Compared to the known techniques, the present invention provides the following advantages. The present invention provides an AMOLED pixel driver circuit and pixel driving method, by using a pixel driver circuit of 3T2C structure to effectively compensate threshold voltage of driving TFT in each pixel; through adding a third TFT and introducing control signal voltage to control the third TFT to prevent current from flowing through in the threshold voltage detection phase and threshold voltage compensation phase so as to reduce the complexity of the power supply signal; by adding a second capacitor to regulate the influence on the source voltage of the driving TFT by the data signal voltage so as to reduce the data signal complexity. As a result, the data signal only needs to switch once.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
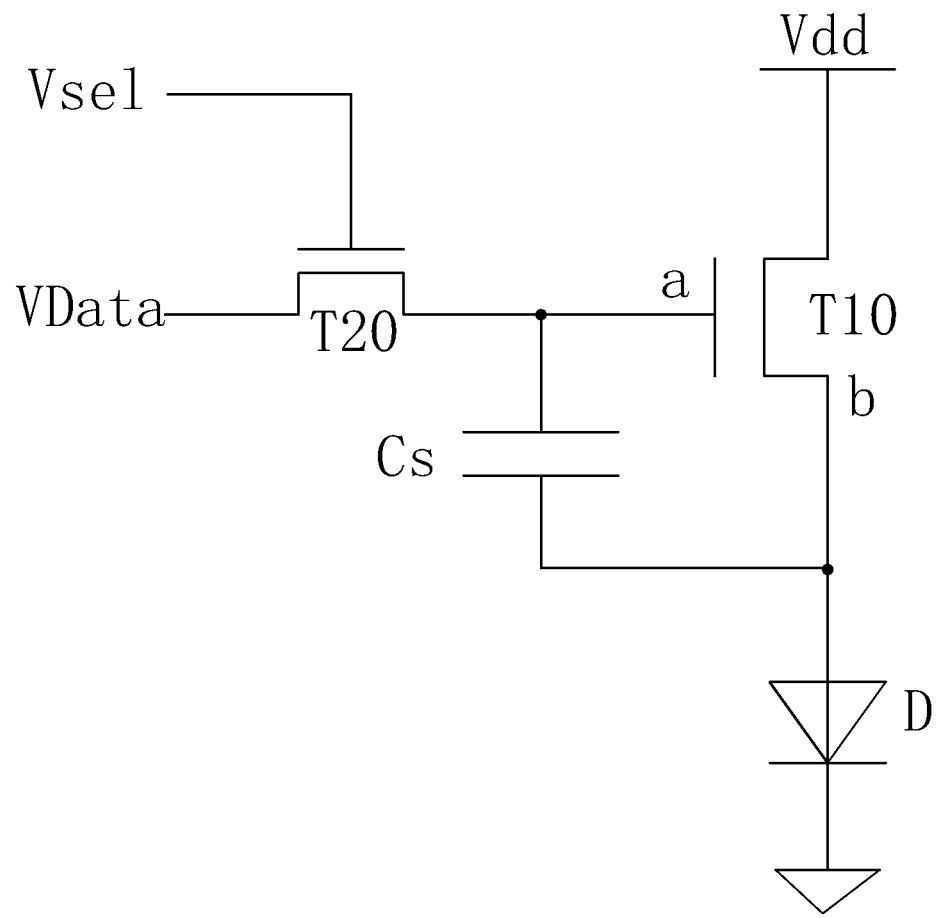
FIG. 1 is a schematic view showing a known 2T1C pixel driver circuit for AMOLED.
Figure 2:
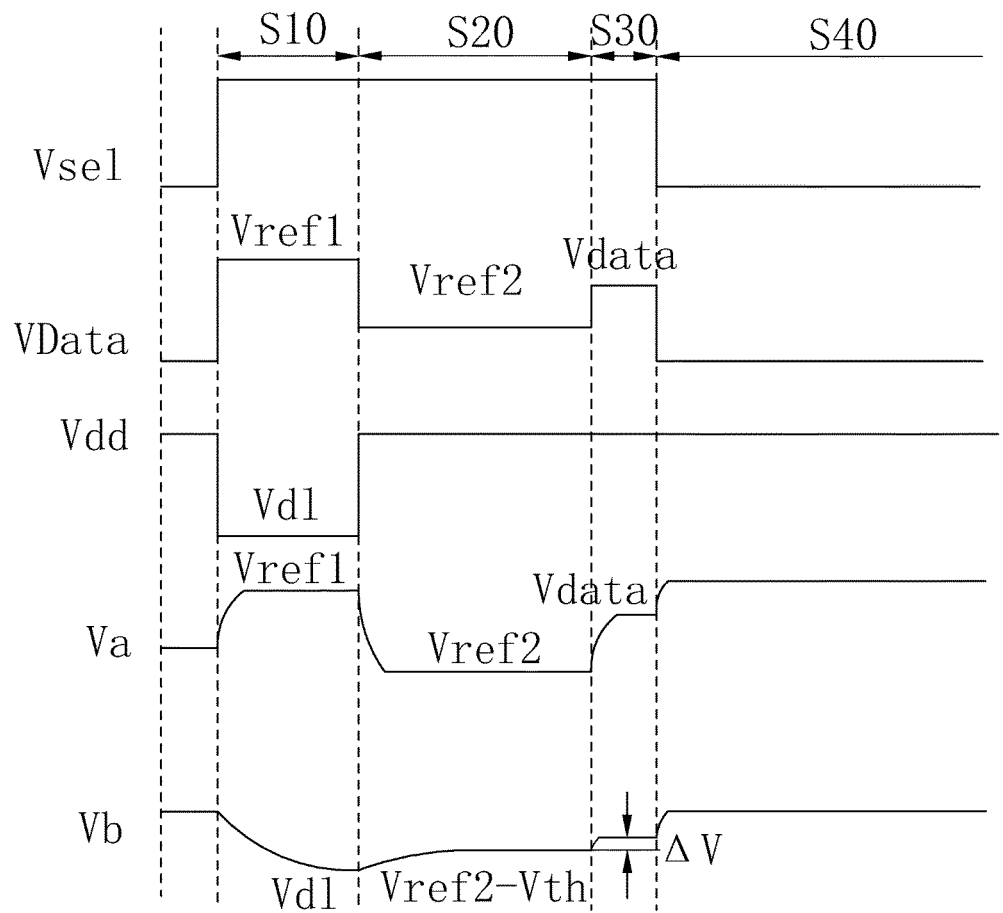
FIG. 2 is a schematic view showing the operation phases of the circuit in FIG. 1 and the waveform of corresponding key nodes.
Figure 3:
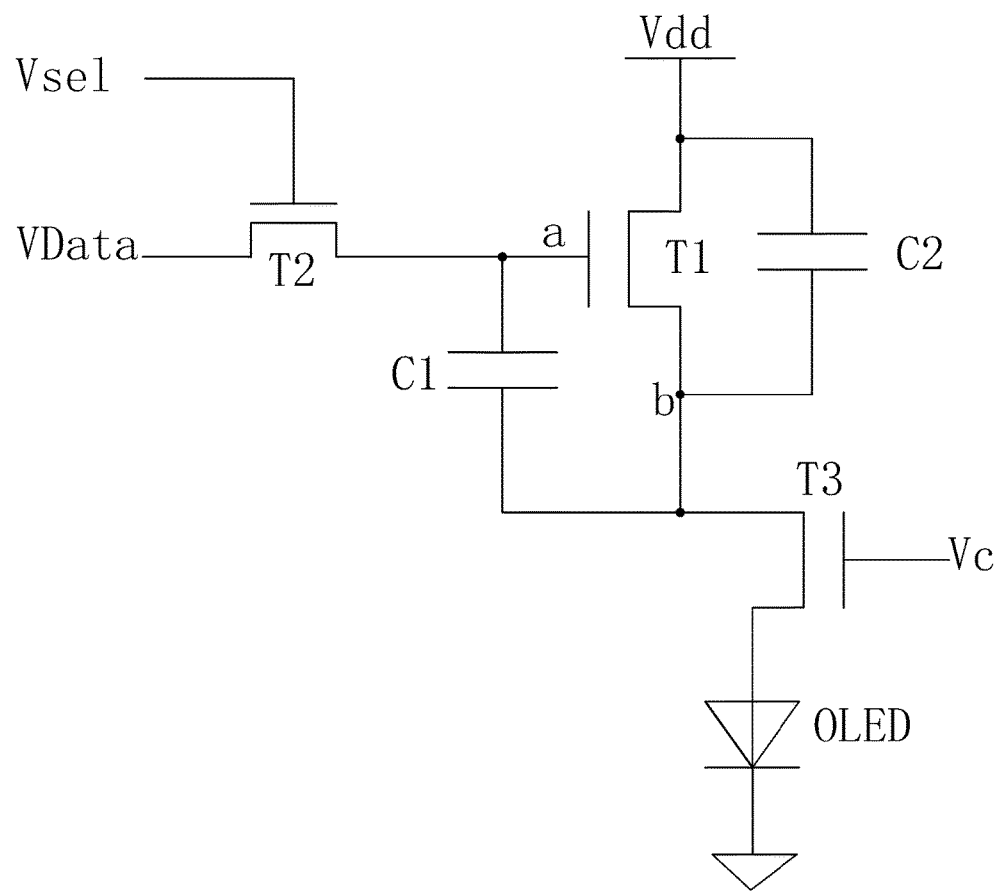
FIG. 3 is a schematic view showing a pixel driver circuit for AMOLED provided by an embodiment of the present invention.

Referring to FIG. 3, the present invention provides an AMOLED pixel driver circuit, which comprises: a first thin film transistor (TFT) T1, a second TFT T2, a third TFT T3, a first capacitor C1, a second capacitor C2, and an organic light-emitting diode (OLED) OLED.

The first TFT T1 has the gate connected to a first node a, the source connected to a second node b and the drain connected to a power supply Vdd.

The second TFT T2 has the gate connected to a scan signal voltage Vsel, the source connected to a data signal voltage VData and the drain connected to the first node a and the gate of the first TFT T1.

The third TFT T3 has the gate connected to a control signal voltage Vc, the drain connected to the second node b and the source of the first TFT T1, and the source connected to the anode of the OLED OLED.

The first capacitor C1 has one end connected to the first node a and the other end connected to the second node b.

The second capacitor C2 has one end connected to the drain of the first TFT T1 and the other end connected to the source of the first TFT T1.

The OLED OLED has cathode connected to the ground.

The first TFT T1 is the driving TFT.

Specifically, the first TFT T1, the second TFT T2 and the third TFT T3 are all low temperature polysilicon (LTPS) TFTs, oxide semiconductor TFTs or amorphous silicon (a-Si) TFTs.

Specifically, the scan signal voltage Vsel, the control signal voltage Vc and the data signal voltage VData are all generated by an external timing controller.

Figure 4:
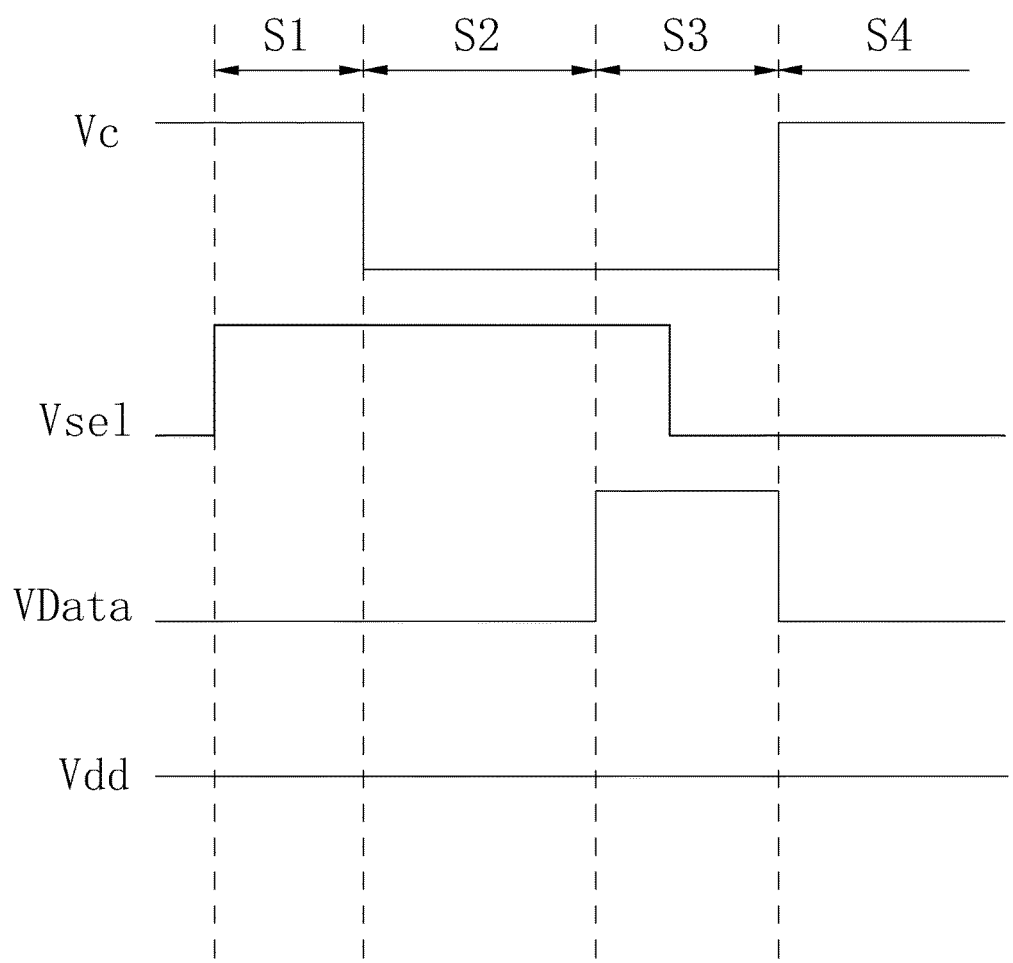
FIG. 4 is a schematic view showing a pixel driver circuit for AMOLED provided by an embodiment of the present invention.
Figure 5:
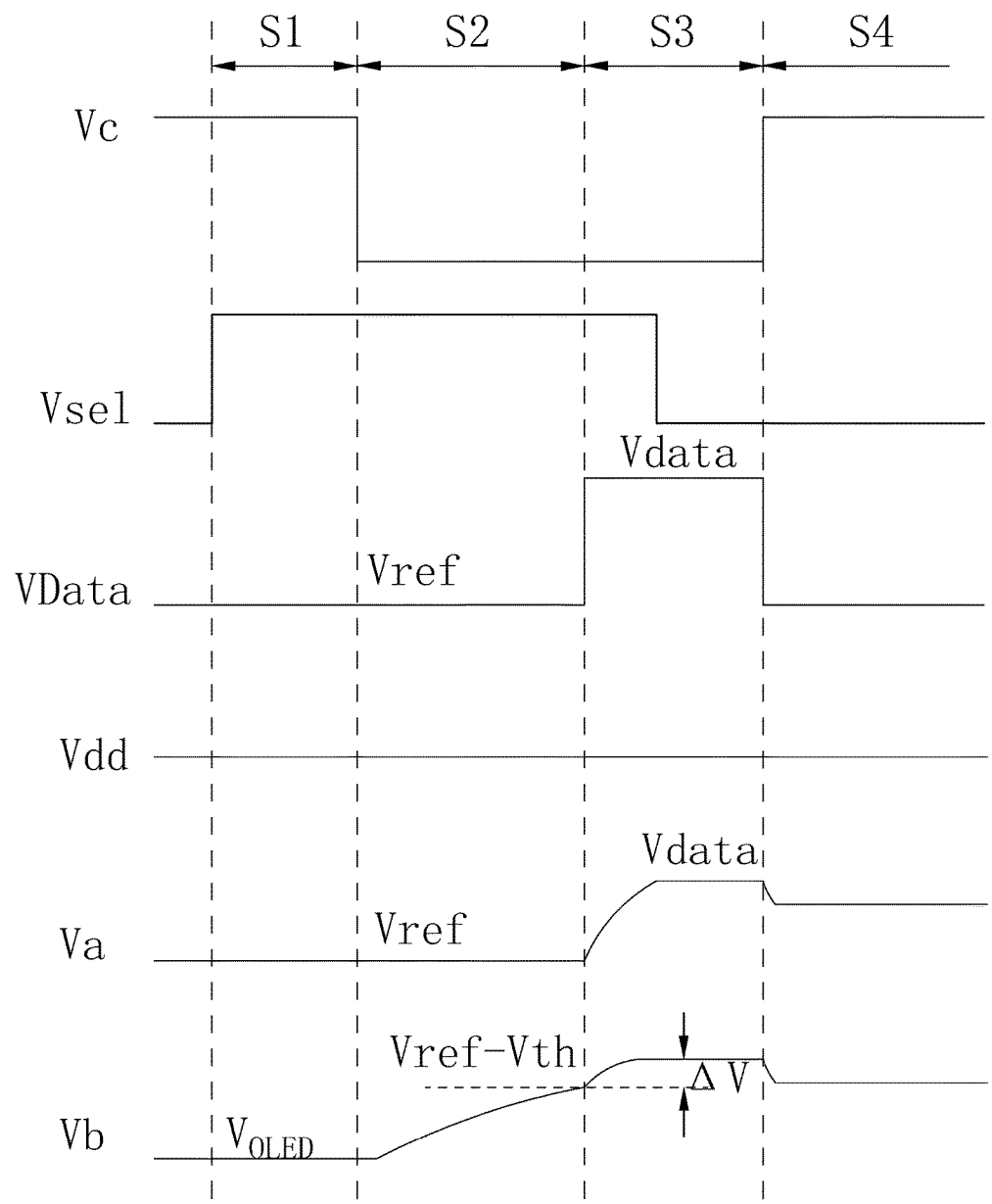
FIG. 5 is a schematic view showing the operation phases of the circuit provided by an embodiment of the present invention and the waveform of corresponding key nodes.

In addition, referring to FIGS. 3-5, the power supply Vdd is a constant high voltage, the control signal voltage Vc is a high level single pulse, the data signal voltage Vdd is a high level pulse. The scan signal voltage Vsel, the control signal voltage Vc and the data signal voltage VData are combined to correspond in series to a reset phase S1, a threshold voltage detection phase S2, a threshold voltage compensation phase S3 and a light-emitting phase S4.

In the reset phase S1, the scan signal voltage Vsel and the control signal voltage Vc are high level, and the data signal voltage VData is a reference low level.

In the threshold voltage detection phase S2, the scan signal voltage Vsel is high level, the control signal voltage Vc is low level, and the data signal voltage VData is a reference low level Vref.

In the threshold voltage compensation phase S3, the scan signal voltage first Vsel maintains high level and then transits to low level, the control signal voltage Vc is low level, and the data signal voltage VData is a display data signal high level Vdata.

In the light-emitting phase S4, the scan signal voltage Vsel is low level, the control signal voltage Vc is high level, and the data signal voltage VData is low level.

Wherein the scan signal Vsel is used to turn on and off the second TFT T2; the first capacitor C1 is for storage; the control signal voltage Vc is used to turn on and off the third TFT T3 and to prevent the current from flowing in the threshold voltage detection phase S2 and the threshold voltage compensation phase S3 to as to reduce the complexity of the power supply Vdd signal; the second capacitor C2 is to regulate the influence on the source voltage of the first TFT T1 (i.e., the driving TFT) by the data signal voltage VData so as to reduce the complexity of the data signal so that the data signal only needs to switch once.

Referring to FIGS. 6-9, in combination with FIGS. 4-5 and based on the AMOLED pixel driver circuit, the present invention also provides an AMOLED pixel driving method, which comprises the following steps:

Step 1: providing an AMOLED pixel driver circuit of 3T2C structure as shown in FIG. 3, wherein the power supply Vdd being a constant high voltage, the control signal voltage Vc being a high level single pulse, the data signal voltage Vdd being a high level pulse.

The details of the circuit will not be repeated here.

Figure 6:
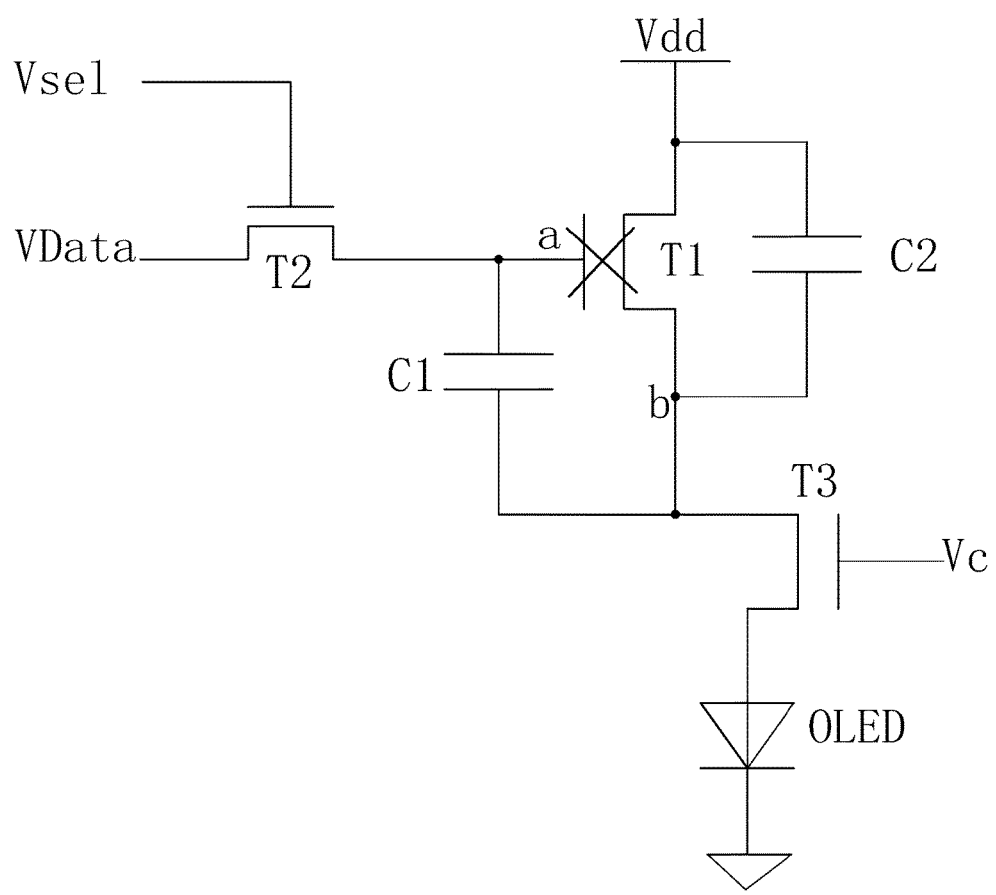
FIG. 6 is a schematic view showing Step 2 of the pixel driving method provided by an embodiment of the present invention.

Step 2: referring to FIG. 6, in combination with FIGS. 4-5, entering the reset phase S1.

The scan signal voltage Vsel and the control signal voltage Vc provide high level, and the data signal voltage VData provides a reference low level Vref, the second TFT T2 is turned on, the reference low level Vref of the data signal voltage VData is written into the first node a (i.e., the gate of the first TFT T1), the third TFT T3 is turned on, the first TFT T1 is cut off, voltage level of the anode $V_{OLED}$ of the OLED OLED is written into the second node b (i.e., the source of the first TFT T1).

In the reset phase S1:

$Vg=Va=Vref$ $Vs=Vb=V_{OLED}$

Wherein Vg is the gate voltage of the first TFT T1, Va is the voltage of the first node a, Vs is the source voltage of the first TFT T1, and Vb is the voltage of the second node b.

Figure 7:
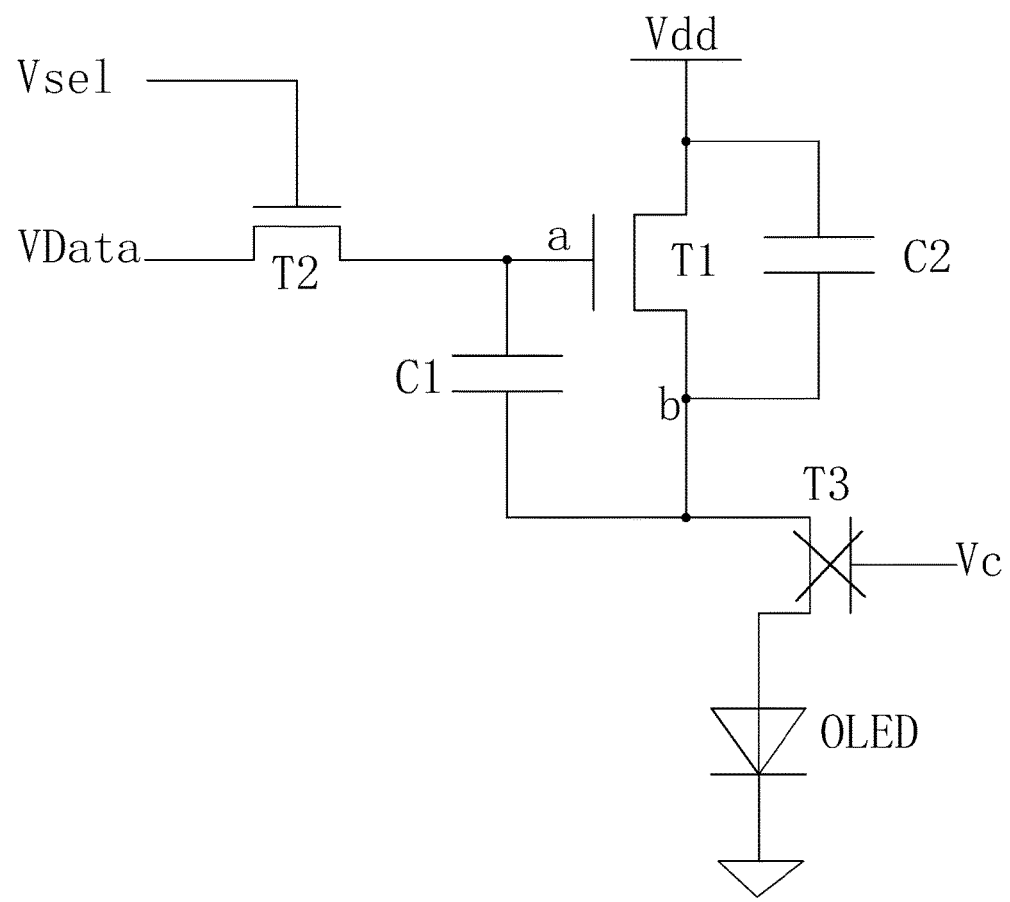
FIG. 7 is a schematic view showing Step 3 of the pixel driving method provided by an embodiment of the present invention.

Step 3: referring to FIG. 7, in combination with FIGS. 4-5, entering threshold voltage detection phase S2.

The scan signal voltage Vsel remains high level, the control signal voltage Vc transits to low level, and the data signal voltage VData remains a reference low level Vref, the second TFT T2 is turned on, the first node a (i.e., the gate of the first TFT T1) remains the reference low level Vref, the third TFT T3 is cut off, the second node b (i.e., the source of the first TFT T1) is changed to Vref-Vth, wherein Vth is threshold voltage of the first TFT T1.

In the threshold voltage detection phase S2:

$Vg=Va=Vref$ $Vs=Vb=Vref-Vth$

Figure 8:
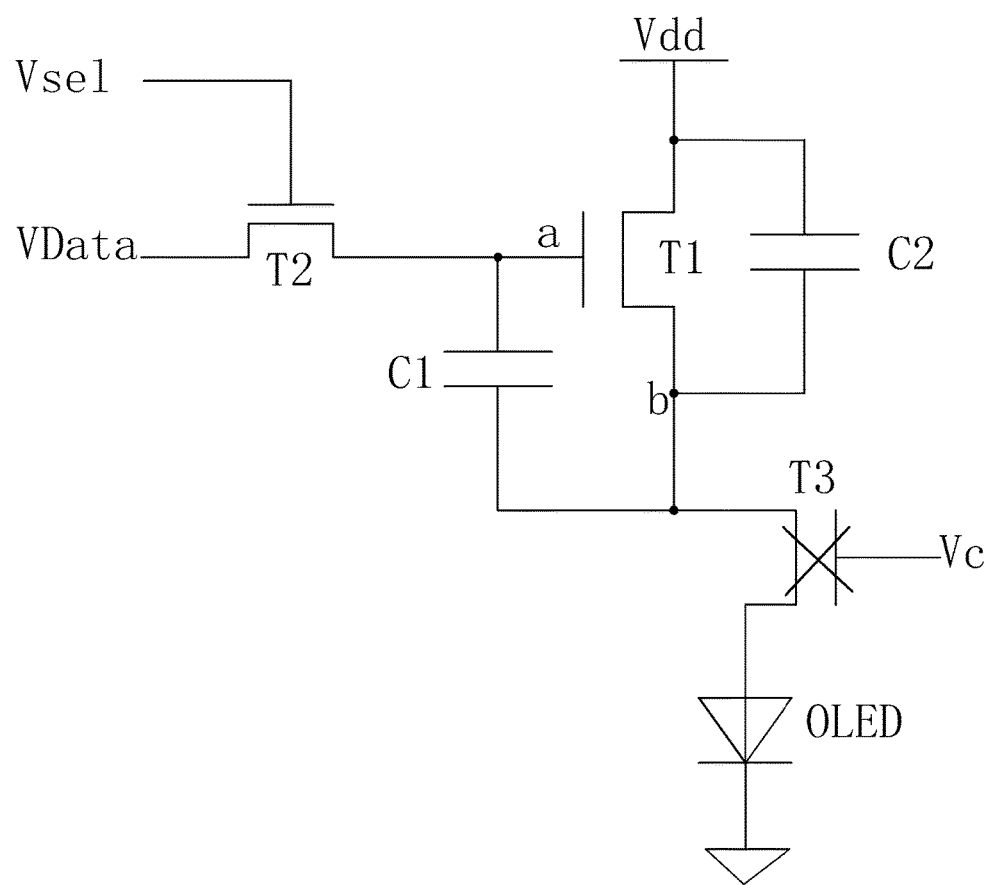
FIG. 8 is a schematic view showing Step 4 of the pixel driving method provided by an embodiment of the present invention.

Step 4: referring to FIG. 8, in combination with FIGS. 4-5, entering threshold voltage compensation phase S3.

The scan signal voltage Vsel first remains high level and then transits to low level, the control signal voltage Vc remains low level, and the data signal voltage provides a display data signal high level Vdata, the second TFT T2 is turned on, the third TFT T3 is cut off, the data signal voltage VData writes the display data signal high level Vdata via the second TFT T2 into the first node a (i.e., the gate of the first TFT T1) and the first capacitor C1, the second node b (i.e., the source of the first TFT T1) transits to Vref-Vth+ΔV, wherein ΔV is the influence on the source voltage of the first TFT T1 (i.e., the second node b) caused by the display data signal high level voltage Vdata.

In the threshold voltage compensation phase S3:

$Vg=Va=Vref$ $Vs=Vb=Vref-Vth+\Delta V$

Then, the voltage difference Vgs between the gate voltage Vg and source voltage Vs of the first TFT T1 is:

$Vgs=Vg-Vs=Vdata-Vref+Vth-\Delta V$

Figure 9:
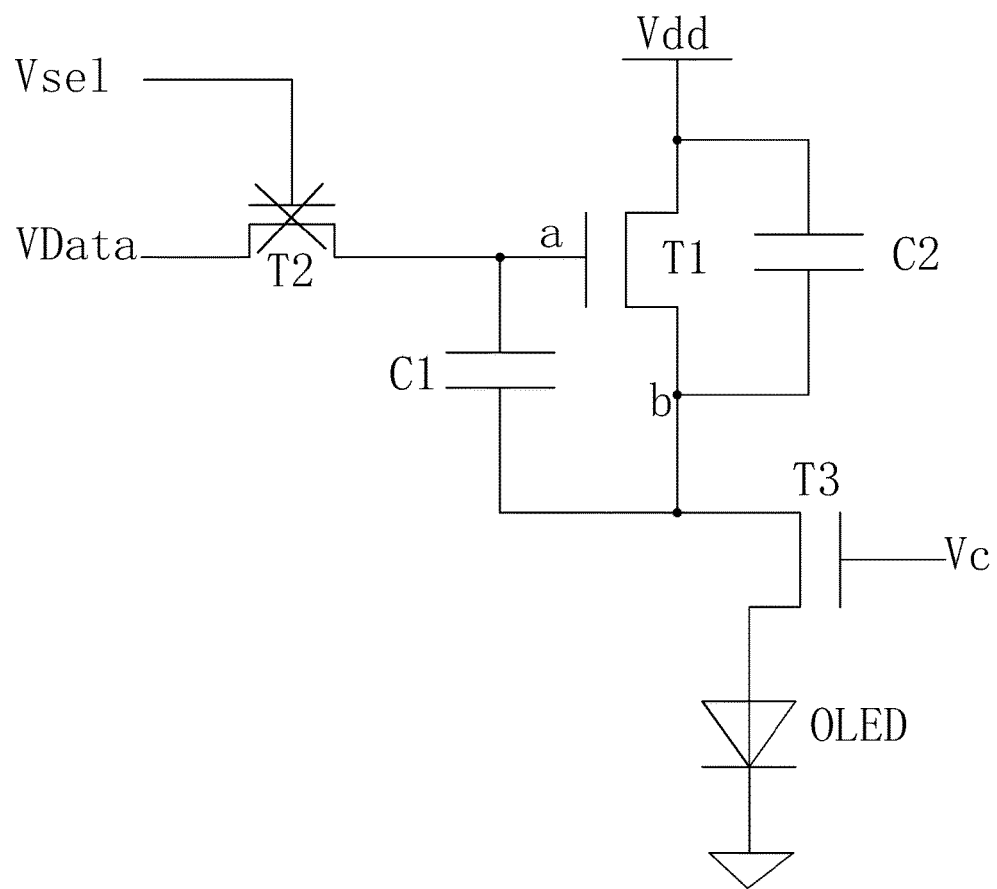
FIG. 9 is a schematic view showing Step 5 of the pixel driving method provided by an embodiment of the present invention.

Step 5: referring to FIG. 9, in combination with FIGS. 4-5, entering light-emitting phase S4.

The scan signal voltage Vsel remains low level, the control signal voltage Vc transits to high level, and the data signal voltage VData transits to low level, the second TFT T2 is cut off, the third TFT T3 is turned on, voltage difference between the first node a (i.e., the gate of the first TFT T1) and the second node b (i.e., the source of the first TFT T1) remains unchanged due to storage effect of the first capacitor C1.

That is, $Vgs=Vdata-Vref+Vth-\Delta V$

Furthermore, the equation to compute the current flowing through the OLED OLED is:

$$I_{OLED}=1/2Cox(\mu W/L)(Vgs-Vth)^2 \quad (1)$$

Wherein $I_{OLED}$ is the current flowing through the OLED OLED, μ is the carrier migration rate of the driving TFT, W and L are the width and length of channel of the driving TFT, Vgs is the voltage difference between the gate and the source of the driving TFT, and Vth is the threshold voltage of the driving TFT. In the present invention, the threshold voltage Vth of the driving TFT is the threshold voltage Vth of the first TFT T1. Substituting the Vgs=Vdata-Vref+Vth-ΔV into equation (1):

$$I_{OLED} = 1/2Cox(\mu W/L)(Vdata-Vref+Vth-\Delta V-Vth)^2 =$$
$$1/2Cox(\mu W/L)(Vdata-Vref-\Delta V)^2$$

As shown, the current $I_{OLED}$ flowing through the OLED OLED is independent of the threshold voltage of the first TFT T1, which achieves compensation. When the OLED OLED emits light, the current $I_{OLED}$ flowing through the OLED OLED is independent of the threshold voltage of the first TFT T1.

In the pixel driving method of the present invention, the power supply Vdd remains a constant high level. Compared to known technique, the the power supply Vdd signal is simplified and the complexity is reduced; the data signal voltage VData only needs only to switch between a reference low level Vref and the display data signal high level Vdata and shows a form of high level pulse soa s to reduce the complexity of the data signal.

Figure 10:
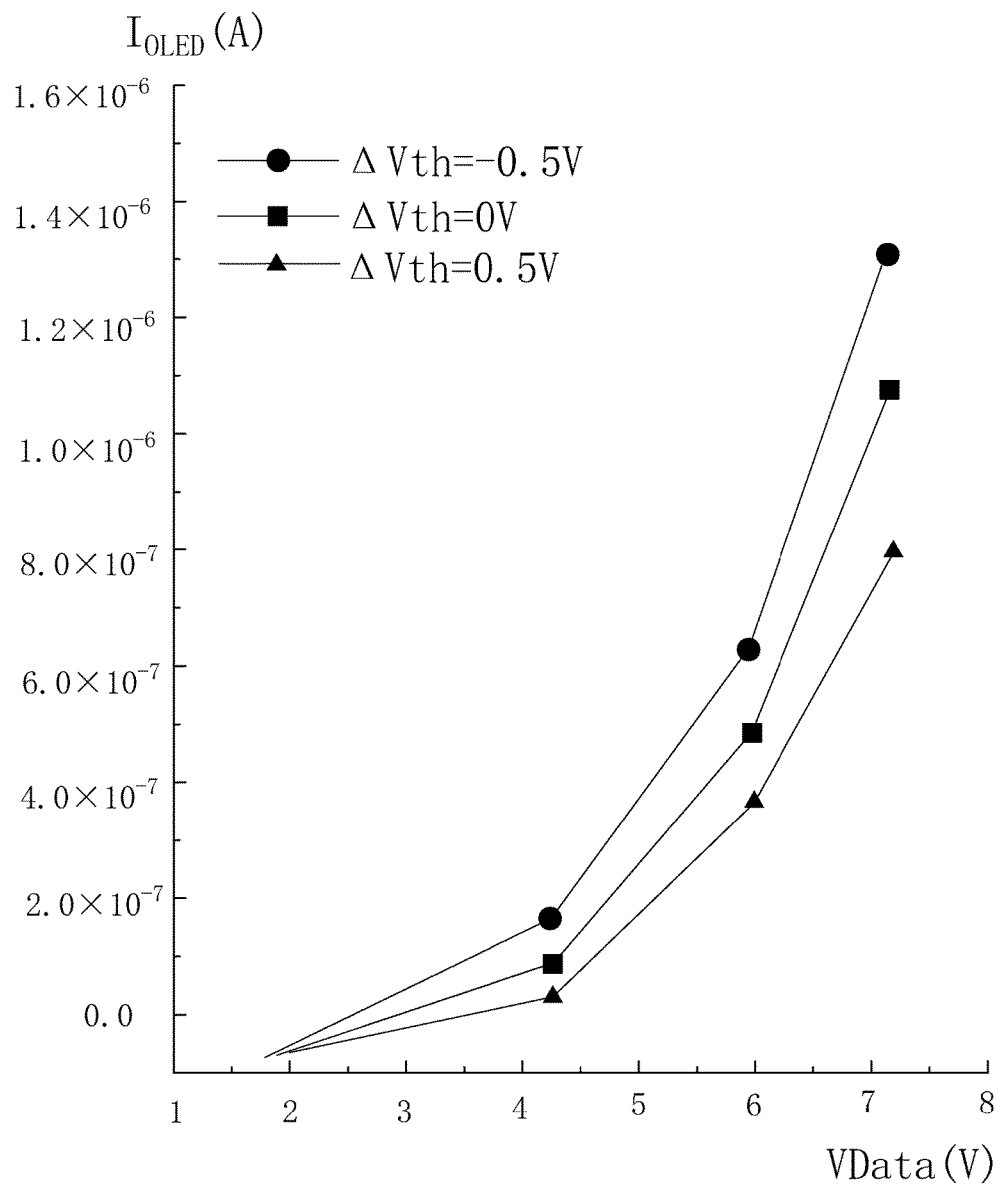
FIG. 10 is a schematic view showing analog data of the threshold voltage drifting of the driving TFT in a known 2T1C pixel driver circuit and corresponding current flowing through OLED.
Figure 11:
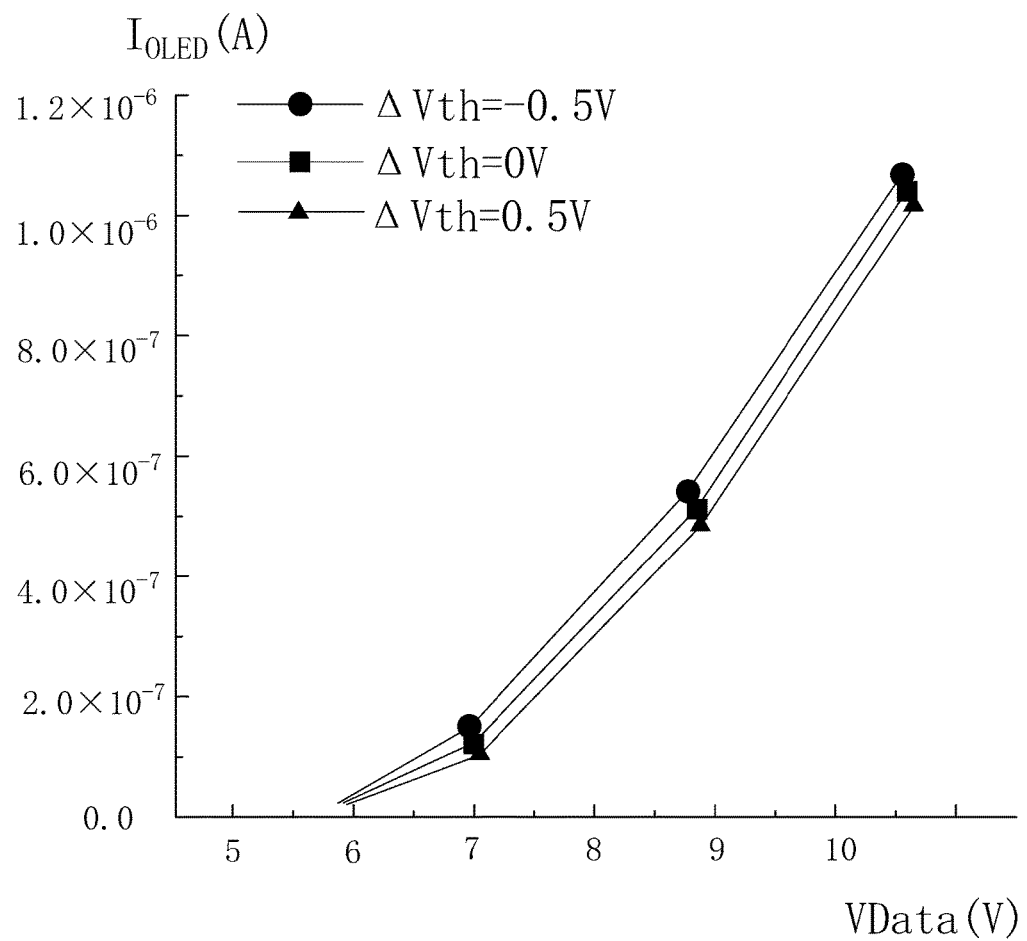
FIG. 11 is a schematic view showing analog data of the threshold voltage drifting of the driving TFT in the pixel driver circuit provided by an embodiment of the present invention and corresponding current flowing through OLED.

Referring to FIGS. 10-11, FIG. 10 is a schematic view showing analog data of the threshold voltage drifting of the driving TFT in a known 2T1C pixel driver circuit and corresponding current flowing through OLED; and FIG. 11 is a schematic view showing analog data of the threshold voltage drifting of the driving TFT in the pixel driver circuit provided by an embodiment of the present invention and corresponding current flowing through OLED, with drifting 0V, +0.5V, -0.5V. In comparison, the amount of change in the current flowing through the OLED in the present invention is obviously less than the current change in the known 2T1C structure. Therefore, the present invention effectively compensates the threshold voltage of the driving TFT to ensure the light-emitting stability and improve the luminance uniformity of the AMOLED and display quality.

In summary, the present invention provides an AMOLED pixel driver circuit and pixel driving method, by using a pixel driver circuit of 3T2C structure to effectively compensate threshold voltage of driving TFT in each pixel; through adding a third TFT and introducing control signal voltage to control the third TFT to prevent current from flowing through in the threshold voltage detection phase and threshold voltage compensation phase so as to reduce the complexity of the power supply signal; by adding a second capacitor to regulate the influence on the source voltage of the driving TFT by the data signal voltage so as to reduce the data signal complexity. As a result, the data signal only needs to switch once.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An active matrix organic light-emitting diode (AMO-LED) pixel driver circuit, which comprises: a first thin film transistor (TFT), a second TFT, a third TFT, a first capacitor, a second capacitor, and an organic light-emitting diode (OLED);
    the first TFT having the gate connected to a first node, the source connected to a second node and the drain connected to a power supply;
    the second TFT having the gate connected to a scan signal voltage, the source connected to a data signal voltage and the drain connected to the first node and the gate of the first TFT;
    the third TFT having the gate connected to a control signal voltage, the drain connected to the second node and the source of the first TFT, and the source connected to the anode of the OLED;
    the first capacitor having one end connected to the first node and the other end connected to the second node;
    the second capacitor having one end connected to the drain of the first TFT and the other end connected to the source of the first TFT;
    the OLED having cathode connected to the ground; and
    the power supply being a constant high voltage, the control signal voltage being a high level single pulse, the data signal voltage being a high level pulse.

2. The AMOLED pixel driver circuit as claimed in claim 1, wherein the first TFT, the second TFT and the third TFT are all low temperature polysilicon (LTPS) TFTs, oxide semiconductor TFTs or amorphous silicon (a-Si) TFTs.

3. The AMOLED pixel driver circuit as claimed in claim 1, wherein the scan signal voltage, the control signal voltage and the data signal voltage are all generated by an external timing controller.

4. The AMOLED pixel driver circuit as claimed in claim 1, wherein the scan signal voltage, the control signal voltage and the data signal voltage are combined to correspond in series to a reset phase, a threshold voltage detection phase, a threshold voltage compensation phase and a light-emitting phase;
    in the reset phase, the scan signal voltage and the control signal voltage are high level, and the data signal voltage is a reference low level;
    in the threshold voltage detection phase, the scan signal voltage is high level, the control signal voltage is low level, and the data signal voltage is a reference low level; and
    in the threshold voltage compensation phase, the scan signal voltage first maintains high level and then transits to low level, the control signal voltage is low level, and the data signal voltage is a display data signal high level; and
    in the light-emitting phase, the scan signal voltage is low level, the control signal voltage is high level, and the data signal voltage is low level.

5. An active matrix organic light-emitting diode (AMO-LED) pixel driving method, which comprises:
    Step 1: providing an AMOLED pixel driver circuit, comprising: a first thin film transistor (TFT), a second TFT, a third TFT, a first capacitor, a second capacitor, and an organic light-emitting diode (OLED);
    the first TFT having the gate connected to a first node, the source connected to a second node and the drain connected to a power supply;
    the second TFT having the gate connected to a scan signal voltage, the source connected to a data signal voltage and the drain connected to the first node and the gate of the first TFT;
    the third TFT having the gate connected to a control signal voltage, the drain connected to the second node and the source of the first TFT, and the source connected to the anode of the OLED;
    the first capacitor having one end connected to the first node and the other end connected to the second node;
    the second capacitor having one end connected to the drain of the first TFT and the other end connected to the source of the first TFT;
    the OLED having cathode connected to the ground;
    the power supply being a constant high voltage;
    Step 2: entering reset phase:
    the scan signal voltage and the control signal voltage providing high level, and the data signal voltage providing a reference low level Vref, the second TFT turned on, the reference low level of the data signal voltage being written into the first node (i.e., the gate of the first TFT), the third TFT turned on, the first TFT cut off, voltage level of the anode of the OLED being written into the second node (i.e., the source of the first TFT);
    Step 3: entering threshold voltage detection phase:
    the scan signal voltage remaining high level, the control signal voltage transiting to low level, and the data signal voltage remaining a reference low level, the second TFT turned on, the first node (i.e., the gate of the first TFT) remaining the reference low level, the third TFT cut off, the second node (i.e., the source of the first TFT) changed to Vref-Vth, wherein Vth being threshold voltage of the first TFT;
    Step 4: entering threshold voltage compensation phase:
    the scan signal voltage first remaining high level and then transiting to low level, the control signal voltage remaining low level, and the data signal voltage providing a display data signal high level, the second TFT turned on, the third TFT cut off, the data signal voltage writing the display data signal high level via the second TFT into the first node (i.e., the gate of the first TFT) and the first capacitor, the second node (i.e., the source of the first TFT) transiting to Vref-Vth+ΔV, wherein ΔV being influence on the source voltage of the first TFT (i.e., the second node) caused by the display data signal high level voltage; and
    Step 5: entering light-emitting phase:
    the scan signal voltage remaining low level, the control signal voltage transiting to high level, and the data signal voltage transiting to low level, the second TFT cut off, the third TFT turned on, voltage difference between the first node (i.e., the gate of the first TFT) and the second node (i.e., the source of the first TFT) remaining unchanged due to storage effect of the first capacitor;

the OLED emitting light and current flowing through the OLED independent of the threshold voltage of the first TFT.

6. The AMOLED pixel driving method as claimed in claim 5, wherein wherein the first TFT, the second TFT and the third TFT are all low temperature polysilicon (LTPS) TFTs, oxide semiconductor TFTs or amorphous silicon (a-Si) TFTs.

7. The AMOLED pixel driving method as claimed in claim 5, wherein the scan signal voltage, the control signal voltage and the data signal voltage are all generated by an external timing controller.

8. An active matrix organic light-emitting diode (AMOLED) pixel driver circuit, which comprises: a first thin film transistor (TFT), a second TFT, a third TFT, a first capacitor, a second capacitor, and an organic light-emitting diode (OLED);

the first TFT having the gate connected to a first node, the source connected to a second node and the drain connected to a power supply;

the second TFT having the gate connected to a scan signal voltage, the source connected to a data signal voltage and the drain connected to the first node and the gate of the first TFT;

the third TFT having the gate connected to a control signal voltage, the drain connected to the second node and the source of the first TFT, and the source connected to the anode of the OLED;

the first capacitor having one end connected to the first node and the other end connected to the second node;

the second capacitor having one end connected to the drain of the first TFT and the other end connected to the source of the first TFT;

the OLED having cathode connected to the ground;

the power supply being a constant high voltage, the control signal voltage being a high level single pulse, the data signal voltage being a high level pulse;

wherein the first TFT, the second TFT and the third TFT beingre all low temperature polysilicon (LTPS) TFTs, oxide semiconductor TFTs or amorphous silicon (a-Si) TFTs;

wherein the scan signal voltage, the control signal voltage and the data signal voltage are all generated by an external timing controller.

9. The AMOLED pixel driver circuit as claimed in claim 8, wherein the scan signal voltage, the control signal voltage and the data signal voltage are combined to correspond in series to a reset phase, a threshold voltage detection phase, a threshold voltage compensation phase and a light-emitting phase;

in the reset phase, the scan signal voltage and the control signal voltage are high level, and the data signal voltage is a reference low level;

in the threshold voltage detection phase, the scan signal voltage is high level, the control signal voltage is low level, and the data signal voltage is a reference low level;

in the threshold voltage compensation phase, the scan signal voltage first maintains high level and then transits to low level, the control signal voltage is low level, and the data signal voltage is a display data signal high level; and in the light-emitting phase, the scan signal voltage is low level, the control signal voltage is high level, and the data signal voltage is low level.

* * * * *